United States Patent [19]
Baranochnikov et al.

[11] Patent Number: 5,742,080
[45] Date of Patent: Apr. 21, 1998

[54] MAGNETICALLY CONTROLLED LOGIC CELL

[75] Inventors: Mikhail Lvovich Baranochnikov, Moscow; Gennady Yakovlevich Krasnikov, Zelenograd; Viktor Naumovich Mordkovich, Moscow; Pavel Sergeevich Prikhodko, Zelenograd; Valery Alexandrovich Mikhailov, Moscow, all of Russian Federation

[73] Assignee: Aktsionernoe Obschestvo VL, Russian Federation

[21] Appl. No.: 676,182

[22] PCT Filed: Jan. 5, 1995

[86] PCT No.: PCT/RU95/00001

§ 371 Date: Sep. 18, 1996

§ 102(e) Date: Sep. 18, 1996

[87] PCT Pub. No.: WO95/19648

PCT Pub. Date: Jul. 20, 1995

[30] Foreign Application Priority Data

Jan. 14, 1994 [RU] Russian Federation ....... 94.000985/25

[51] Int. Cl.$^6$ ............... H01L 29/82; H01L 43/00; H01L 27/10
[52] U.S. Cl. .............. 257/207; 257/421; 257/427
[58] Field of Search .............. 257/207, 208, 257/421, 427, 414, 425; 326/38, 187; 437/52; 327/511

[56] References Cited

U.S. PATENT DOCUMENTS

| | | | |
|---|---|---|---|
| 3,816,766 | 6/1974 | Anselino et al. | 327/187 |
| 4,677,380 | 6/1987 | Popovic et al. | 257/421 |
| 5,245,227 | 9/1993 | Furtek et al. | 326/38 |
| 5,329,480 | 7/1994 | Wu et al. | 257/421 |
| 5,572,058 | 11/1996 | Biard | 257/421 |
| 5,614,754 | 3/1997 | Inoue | 257/421 |
| 5,627,398 | 5/1997 | Zlebir et al. | 257/421 |

FOREIGN PATENT DOCUMENTS

| | | |
|---|---|---|
| 0106943 | 5/1984 | European Pat. Off. |
| 1499747 | 12/1975 | Germany |
| 2253941 | 9/1992 | United Kingdom |

Primary Examiner—Stuart S. Levy
Assistant Examiner—Adriana Giordana
Attorney, Agent, or Firm—Brumbaugh, Graves, Donohue & Raymond

[57] ABSTRACT

A magnetically controlled logic cell comprising a semiconductor substrate (1) coated with a dielectric film and containing four field-effect transistors; four current supply buses in contact with the transistors and arranged on the surface of the dielectric film (17), two of the buses in question being power supply buses (34, 35), the other two being output buses (36, 37); and a region insulated from the substrate by a layer of concealed dielectric and by side insulation, the region in question containing four contacts configured symmetrically in pairs and connected to said transistors, power supply buses (34, 35) and output buses (36, 37).

1 Claim, 2 Drawing Sheets

MAGNETICALLY CONTROLLED LOGIC CELL

BACKGROUND OF THE INVENTION

The present invention relates to the field of microelectronics and more particularly to magnetically controlled integrated circuits and could be used for building up memory cells and in sensor control devices.

There are known magnetically controlled logic cells with operating principle based on changing of output signal in effect with external magnetic field. They constitute devices comprising a transformer of magnetic field into electric signal and an electronic circuit of processing the signal placed in a single semiconductor crystal. The most common transformer of magnetic field into electric signal is a Hall element, operating principle of which is based on developing the EMF between two contacts located on the opposite sides of a rectangular semiconductor sample placed in the magnetic field, with electric current running between two contacts located on another sides of the semiconductor.

The EMF forming by the Hall element in a magnetically controlled logic cell is passed to the input of an integrated circuit and results in forming the signal on circuit output which is, depending on the intensity of the magnetic field, corresponding to a logical 0 or logical 1. The magnetically controlled cell with Hall element is usually produces of silicon using the conventional epitaxial-planar technology (U.S. Pat. No. 3,816,766, M.cl.G11C 11/40, publ. in 1974).

The common drawbacks of the existing magnetically controlled logic cells is their insufficient magnetic sensitivity and high level of power consumption. The first leads to impossibility of using this logic cell in low intensity magnet fields (on the order of one milli-Tesla) without complicating of the electronic circuit, mostly by adding amplifying stages. The second drawback is associated with high value of electric current running through the Hall element in a state of waiting for magnetic signal. This drawback also considerably restricts the practical application of the magnetically controlled logic cells.

The mentioned drawbacks are directly associated with the value of electric resistance of the Hall element. In the present invention it is proposed a design of the magnetically controlled logic cell which provides the increasing of the electric resistance of the Hall element resulting in increasing of magnetic sensitivity and decreasing of power consumption.

SUMMARY OF THE INVENTION

It is an object of the present invention to increase the magnetic sensitivity and to decrease the power consumption of the magnetically controlled logic cells.

This object is achieved by that way that the magnetically controlled logic cell comprises a semiconductor substrate of the first type conductivity, eight alloyed regions of the second type conductivity creating in pairs drain and source regions of four field-effect transistors, a dielectric film arranged on the surface of the substrate having openings over each of the drain and source regions, eight conducting contact regions located over the drain and source regions on their surface and on the surface of the dielectric film, four conducting gate regions each situated on the surface of the dielectric film between the drain and source regions of each transistor, four current supply buses arranged on the surface of the dielectric film, the first of which is adjoining the source regions of the first and second transistors and being a power supply bus, the second one is adjoining the source and gate regions of the third and fourth transistors and being a power supply bus, the third one is adjoining the gate region of the first transistor, source regions of the second and fourth transistors and being an output bus, the fourth one is adjoining the gate region of the second transistor, source regions of the first and third transistors and being an output bus, the substrate of the first type conductivity comprises a concealed dielectric region, insulating region arranged on the perimeter of the concealed dielectric region and adjoining it and the dielectric film, four highly alloyed regions of the first type conductivity adjoining the insulating region and the concealed dielectric region and arranged in pairs and symmetrically in respect to each other near the opposite sides of the region of the first type conductivity created by the concealed dielectric region and insulating region, four conducting contacts to the highly alloyed regions of the first type conductivity and current conducting buses, the first one is adjoining the power supply bus and the contact to one of the highly alloyed regions of the first type conductivity, the second one is adjoining another power supply bus and the opposite contact to another highly alloyed region of the first type conductivity, the third one is adjoining the output bus and the contact of the second pair of the highly alloyed regions of the first type conductivity, the fourth one is adjoining the opposite contact of the second pair of the highly alloyed regions of the first type conductivity and another output bus.

PREFERRED EMBODIMENT

Figure 1:
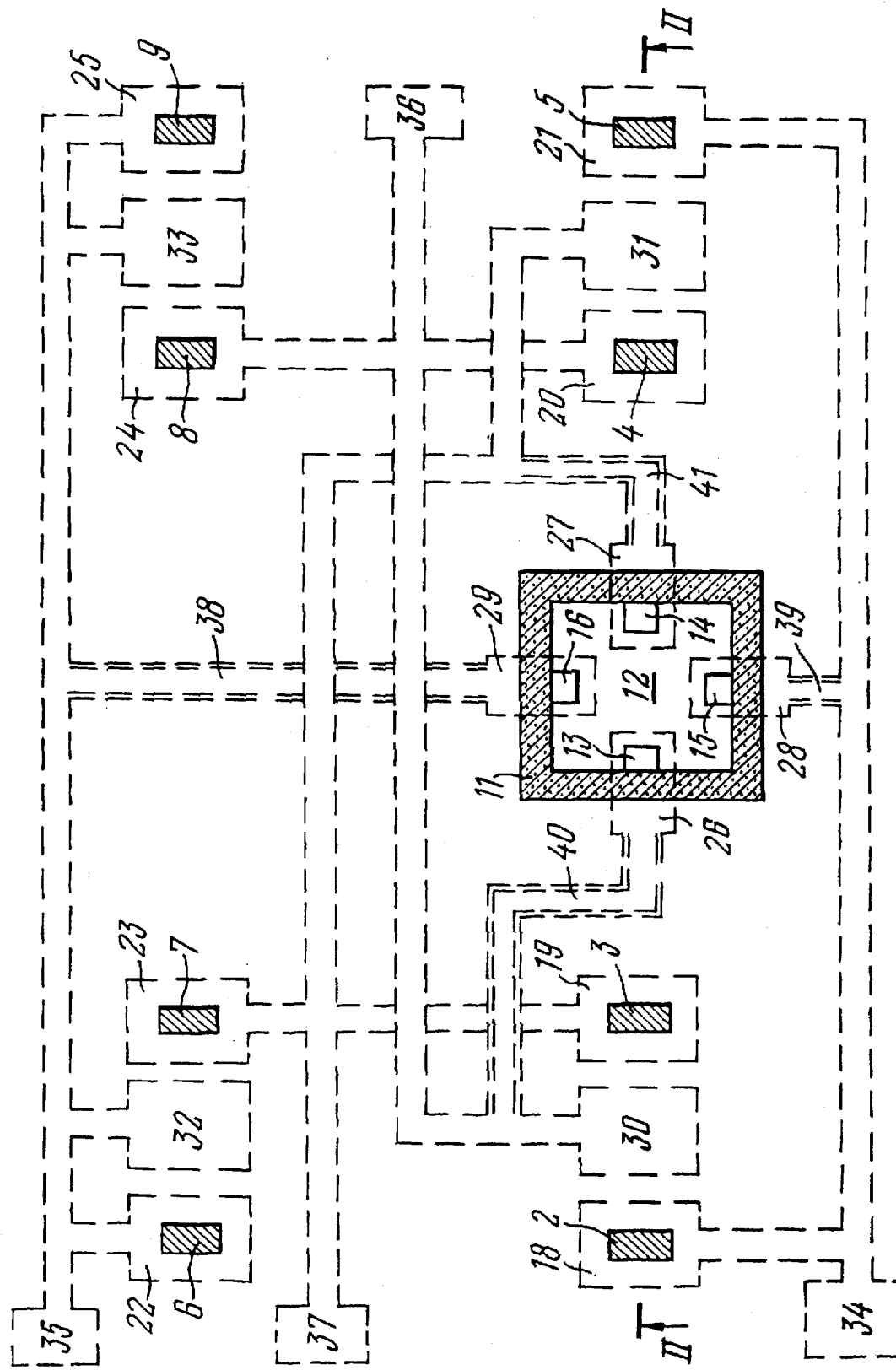
FIG. 1 is a topological diagram of the mangnetically controlled cell.
Figure 2:
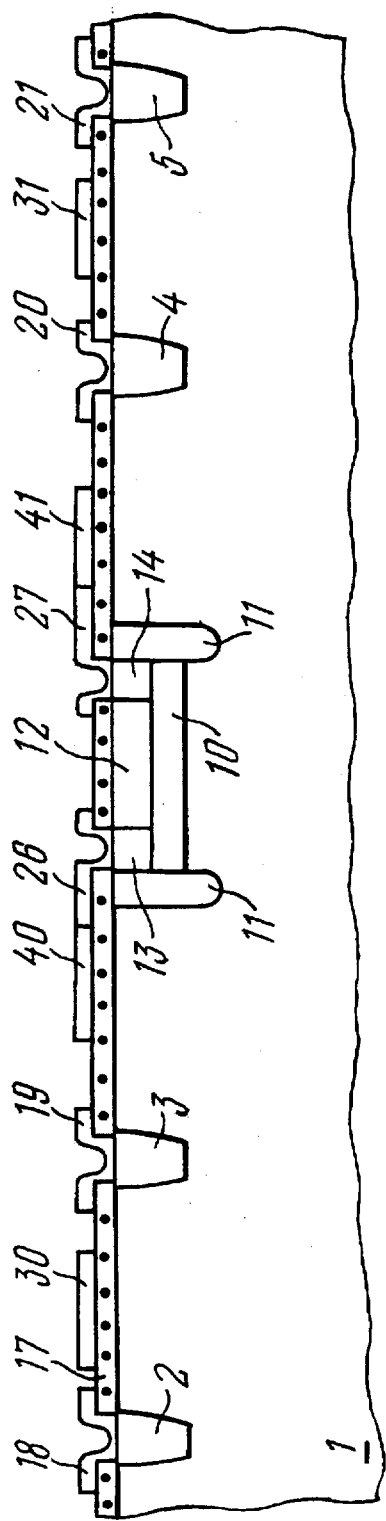
FIG. 2 is a cross-section of the layers (taken along line A—A in FIG. 1).
Figure 3:
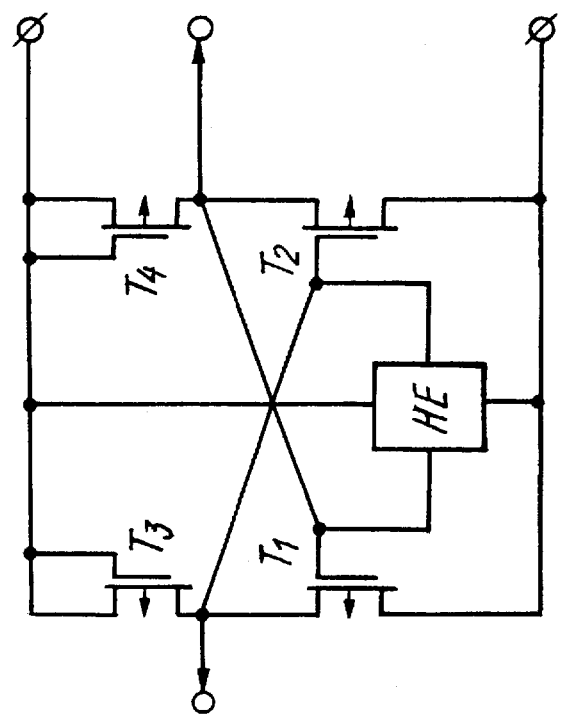
FIG. 3 is an electric diagram of the magnetically controlled cell.

The magnetically controlled logic cell comprises a semiconductor substrate of the first type conductivity—1 (produced, f.e., of monocrystalline silicon), eight alloyed regions of the second type conductivity—2–9, a concealed dielectric region —10 (f.e., of silicon dioxide, nitride or oxynitride), insulating region—11 (f.e., of silicon dioxide or formed by p—n junction), a region of the fist type conductivity—12 arranged on the perimeter of the concealed dielectric region—10 and adjoining the surface of the semiconductor substrate—1 and separated from the semiconductor substrate 1 by the concealed dielectric region 10 and insulating region 11, four highly alloyed regions of the first type conductivity—13–16 arranged symmetrically in pairs inside the region the first type conductivity 12 in the middle of its each side and adjoining the region of the concealed dielectric 10 and the insulating region 11, the dielectric film 17 arranged on the surface of the semiconductor substrate 1 (f.e., of silicon dioxide), conducting contact regions—18–25 leading up to the alloyed regions 2–9 of the second type conductivity and contact regions—26–29 leading up to the highly alloyed regions 13–16 of the first type conductivity arranged on the surface of the semiconductor substrate 1 the dielectric film 17, four conducting regions 30–33 and the current supply buses—34–37 and 38–41 arranged on the surface of the dielectric film 17 (the contact regions, conducting regions, current supply buses are produced, f.e., of aluminum).

The alloyed regions of the second type conductivity 2, 5, 6, 9 constitute the sources and the alloyed regions of the second type conductivity 3, 4 7, 8 constitute the drains of the four field-effect transistors respectively. The conducting regions 30–33 being the gates of these transistors. The region 12 separated from the semiconductor substrate 1 by the concealed dielectric 10 and semiconductor 11 regions constitutes the Hall element, and the highly alloyed regions of the fist type conductivity 13–16 and the contact regions 26–29 being the contact system of the Hall element. The power supply bus 34 is connected through the contact 18 with the source 2 of the first transistor, through the contact 21 with the source 5 of the second transistor and with help of the bus 39 with the contact 28 is connected to the Hall element. The power supply us 35 is connected with the source 6 (through the contact 22) and with the gate 32 of the third transistor, with the source 9 (through the contact 25), the gate 33 of the fourth transistor and, with help of the bus 38 with contact 29, is connected to the Hall element which is opposite to the contact 28. The output bus 36 connects the gate 30 of the first transistor, the drain 4 of the second transistor and the drain 8 of the fourth transistor (through the contact 24) with the contact 26 leading up to the Hall element (through the bus 40). The output bus 37 connects the gate 31 of the second transistor, the drain 3 of the first transistor (through the contact 19) and (through the contact 23) the drain 7 of the third transistor (through the bus 41) with the contact 27 to the Hall element which is opposite the contact 26.

The magnetically controlled logic cell comprises the Hall element (HE) being a controlling element and a symmetrical trigger with direct coupling being a control circuit comprising four transistors. And with the transistors T3 and T4 used as load resistors for the transistors T1 and T2.

The magnetically controlled logic cell functions in following way. In the initial state the transistor T1 is open, and the transistor T2 is closed. On the output 37 there is a potential (signal) of high level, on the output 36 there is a potential of low level. Electric current is running through the contacts 28–29 of the HE (so called, current of the waiting state). Potential on the contacts 26–27 of the HE (in absence of magnetic field) is absent. Under the action of magnetic field there occurring Hall EMF on the HE output (contacts 26–27) which changes the potential of the gate of the transistor T1. If the external magnetic field density B is greater then a curtain threshold level $B_{thres}$, the transistor T1 closes and in result of this the transistor T2 opens and the cell output signal changes. When the external magentic field density is decreasing to the level lover then the threshold level $B_{thres}$, the transistor T1 opens and the transistor T2 closes and the cell output signal is shifting to the initial level.

INDUSTRIAL APPLICABILITY

The advantages of the proposed magnetically controlled cell are the increased magnetic sensibility (approximately up to 10 times) and decreased power consumption (no less then in 2 times).

The fields of applicability of the magnetically controlled logic cells are memory systems, ignition systems in car engines, PC and telephone noncontact keyboards, control circuits of collectorless electric drives, navigation systems. In robot technology it is possible to design on the basis of this circuit control devices for shifting, rotating and approaching of an object. These cells are also applied in automation and control systems, f.e., in control systems of metal-cutting and metal-working machine tools. In home electric appliance they could be used for electric drives control, f.e., in washing machines, vacuum cleaners under the condition of changing load.

We claim:

1. A magnetically controlled logic cell comprising a semiconductor substrate (1) of the first type conductivity, eight alloyed regions of the second type conductivity (2–9) creating in pairs drain and source regions of four field-effect transistors, a dielectric film (17) arranged on the surface of the substrate having openings over each of the drain and source regions, eight conducting contact regions (18–25) located over the drain and source regions on their surface and on the surface of the dielectric film (17), four conducting gate regions (30–33) each situated on the surface of the dielectric film (17) between the drain and source regions of each transistor, four current supply buses (34–37) arranged on the surface of the dielectric film (17) the first (34) of which is adjoining the source regions of the first and second transistors and being a power supply bus, the second one (35) is adjoining the source and gate regions of the third and fourth transistors and being a power supply bus, the third one (36) is adjoining the gate region of the first transistor, source regions of the second and fourth transistors and being an output bus, the fourth one (37) is adjoining the gate region of the second transistor, drain regions of the first and third transistors and being an output bus, characterized in, that the substrate of the first type conductivity comprises a concealed dielectric region (10) an insulating region (11) arranged on the perimeter of the concealed dielectric and adjoining it and the dielectric film (17), four highly alloyed regions of the first type conductivity (13–16) adjoining the insulating region (11) and the concealed dielectric region (10) and arranged symmetrically in pairs in respect to each other near the opposite sides of the region of the first type conductivity created by the concealed dielectric region (10) and insulating region (11), four conducting contacts (26–29) to the highly alloyed regions of the first type conductivity and current supply buses (38–41), the first one (39) of which is adjoining the power supply bus (34–35) and the contact of one of the highly alloyed regions of the first type conductivity, the second one (38) is adjoining another power supply bus and the opposite contact of another highly alloyed region of the first type conductivity, the third one (40) is adjoining the output bus (36) and the contact of the second pair of the highly alloyed regions of the first type conductivity, the fourth on (41) is adjoining the opposite contact of the second pair of the highly alloyed regions and another output bus (37).

* * * * *